United States Patent [19]
Brekelmans

[11] Patent Number: 6,020,936
[45] Date of Patent: *Feb. 1, 2000

[54] TV/FM RECEIVER FOR MULTIMEDIA APPLICATIONS

[75] Inventor: Johannes H.A. Brekelmans, Singapore, Singapore

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/779,419

[22] Filed: Jan. 7, 1997

[30] Foreign Application Priority Data

Jan. 10, 1996 [SG] Singapore ............................ 9600124-3

[51] Int. Cl.⁷ ..................................................... H04N 5/46
[52] U.S. Cl. .......................... 348/725; 348/731; 348/555; 348/553
[58] Field of Search ................................... 348/725, 729, 348/731, 732, 733, 554, 555, 737, 738, 553; H04N 5/46

[56] References Cited

U.S. PATENT DOCUMENTS

| | | | |
|---|---|---|---|
| 4,272,788 | 6/1981 | Ogita | 358/189 |
| 4,851,796 | 7/1989 | Hendriks | 333/129 |
| 4,907,079 | 3/1990 | Turner et al. | 358/84 |
| 5,034,819 | 7/1991 | Tsukagoshi | 358/191.1 |
| 5,103,314 | 4/1992 | Keenan | 358/193.1 |
| 5,148,420 | 9/1992 | Yamamuro | 369/44.11 |
| 5,233,424 | 8/1993 | Nuimura | 358/188 |
| 5,239,379 | 8/1993 | Abe et al. | 358/188 |
| 5,283,653 | 2/1994 | Citta | 348/725 |
| 5,437,051 | 7/1995 | Oto | 455/3.2 |
| 5,440,351 | 8/1995 | Ichino | 348/729 |
| 5,512,963 | 4/1996 | Mankovitz | 348/725 |
| 5,561,457 | 10/1996 | Cragun et al. | 348/725 |
| 5,598,228 | 1/1997 | Saitoh | 348/725 |
| 5,619,279 | 4/1997 | Vacher et al. | 348/725 |
| 5,715,012 | 2/1998 | Patel et al. | 348/725 |
| 5,774,194 | 6/1998 | Armbruster | 348/725 |

FOREIGN PATENT DOCUMENTS

| | | | |
|---|---|---|---|
| 0401932A1 | 12/1990 | European Pat. Off. | H03J 5/24 |
| 4302301A1 | 8/1994 | Germany | H04B 1/26 |
| 6-121240 | 4/1994 | Japan | H04N 5/44 |
| 9221195A1 | 11/1992 | WIPO | H04L 27/30 |

OTHER PUBLICATIONS

Patent Abstracts of Japan, vol. 6, No. 259, E–149, abstract of JP, A, 57–155885 (Zeneraru K.K.), Sep. 27, 1982.

*Primary Examiner*—John K. Peng
*Assistant Examiner*—Jean W. Désir
*Attorney, Agent, or Firm*—Edward W. Goodman

[57] ABSTRACT

A receiver for receiving reception signals of a first type, for example, TV signals, and reception signals of a second type, for example FM-radio signals, is described. The receiver may be used in multimedia applications. In the receiver, an input section TVIN,FMIN,SWIN includes at least two inputs TVIN,FMIN to which reception signals can be applied. One input TVIN may, for example, be coupled to a cable network via which reception signals are distributed. The other input FMIN may, for example, be used to plug-in a simple wire antenna. In many cases, such a wire antenna will be sufficient to receive on-air reception signals with acceptable quality. The invention takes into consideration that on-air reception signals may not always be offered by the cable network. With at least two inputs TVIN,FMIN, there is flexibility of reception.

4 Claims, 4 Drawing Sheets

TV/FM RECEIVER FOR MULTIMEDIA APPLICATIONS

BACKGROUND OF THE INVENTION

1. Field of the Invention

The invention relates to a receiver for receiving reception signals of a first type, for example, TV signals, and reception signals of a second type, for example, FM-radio signals. The invention also relates to a multi-media apparatus incorporating such a receiver. The receiver may enhance the functionality of the multi-media apparatus with, for example, TV and FM-radio reception. The multimedia apparatus may be in the form of a personal computer (PC) having slots in which add-on cards are plugged. The receiver may be implemented on one of these add-on cards. Accordingly, the PC can access information transmitted by FM-radio and TV stations.

2. Description of the Related Art

A receiver capable of receiving TV and FM-radio signals is described in U.S. Pat. No. 5,148,420. In the prior-art receiver, both TV and FM-radio signals are supplied to a single tuner via a common RF input. The single tuner converts a particular reception signal to a fixed intermediate frequency (IF) of approximately 40 MHz, which is common for TV reception. The IF signal produced by the tuner is processed differently for TV or FM-radio reception. For TV reception, the IF signal is processed in a manner which is very similar to IF signal processing in most present-day TV receivers. For FM-radio reception, the IF signal is supplied to a single chip FM-radio integrated circuit (IC) via a filter unit. In the FM-radio IC, the IF signal is frequency-converted to obtain a nominal 10.7 MHz FM IF signal, which is further processed in a common manner.

Although the prior-art receiver is capable of retrieving information from both TV and FM-radio signals received at the common RIF input, the prior-art receiver has a relatively low flexibility.

SUMMARY OF THE INVENTION

It is an object of the invention to provide a receiver which is more flexible in retrieving information than the above described prior-art receiver.

According to one aspect of the invention, there is provided a receiver for receiving reception signals of a first and a second type, the receiver comprising an input section for receiving a reception signal; a tuner for providing, in response to the reception signal, an intermediate frequency signal; a first intermediate frequency signal processing arrangement coupled to process said intermediate frequency signal when receiving said first-type reception signals; and a second intermediate frequency signal processing arrangement coupled to process said intermediate frequency signal when receiving said second-type reception signals, characterized in that said input section comprises a plurality of inputs to which the reception signal may be applied.

According to another aspect of the invention, a multimedia apparatus comprises such a receiver.

Yet another aspect of the invention provides a tuner for receiving reception signals of a first and a second type, the tuner comprising an input section for receiving a reception signal; and a mixer-oscillator arrangement for providing, in response to the reception signal, an intermediate frequency signal, characterized in that said input section comprises a plurality of inputs to which the reception signal may be applied.

The invention may be used in the reception of both TV and FM-radio signals. In an example of such a use, a tuner for receiving both TV and FM-radio signals has an input section which comprises two inputs to which reception signals can be applied. One input may, for example, be coupled to a cable network via which reception signals are distributed. The other input may, for example, be used to plug-in a simple wire antenna. In many cases, such a wire antenna will be sufficient to receive local stations with an acceptable quality. The invention takes into consideration that local stations, or any other on-air reception signal, may not always be offered by the cable network.

The invention is particularly suited for multi-media applications. As indicated in the opening paragraph, a receiver in accordance with the invention may be implemented on an add-on card. The flexibility offered by the invention may further enhance the functionality of the add-on card, so that makes that the add-on card can be used in a great variety of multimedia applications.

Advantageously, the input section comprises a switch for effectively decoupling at least one of the two inputs from the tuner. This embodiment of the invention takes into consideration that user-made wire antennas have an undefined impedance. The undefined impedance at the wire antenna input may affect reception of cable network signals received via the other input. The switch can insulate the undefined impedance from the tuner.

Advantageously, a multi-band tuner is used for processing a reception signal in one of a plurality of branches depending on the frequency of the reception signal, and the switch is coupled to an input of one branch. Accordingly, reception signals which are processed in the other branches effectively by-pass the switch. This embodiment of the invention takes into consideration that, in practice, most switches have non-linearities to some extent. Such non-linearities may impair the reception quality, for example, by causing inter-modulation.

The invention will hereinafter be described in greater detail with reference to examples shown in the drawings. Furthermore, advantageous implementation details will also be described with reference to the examples shown.

BRIEF DESCRIPTION OF THE DRAWINGS

In the drawings.

Like elements have like reference signs throughout the drawings.

DESCRIPTION OF THE PREFERRED EMBODIMENTS

The invention will be described by way of example with reference to the FIG. 1 tuner which can receive both TV and FM-radio signals. In that respect, implementation aspects of the FIG. 1 tuner will also be discussed with reference to FIGS. 2 and 3, and an example of a multi-media application of the FIG. 1 tuner will be discussed with reference to FIG. 4. Finally, some remarks are made so as to indicate that the scope of the invention is well beyond the examples shown in the Figures.

Figure 1:
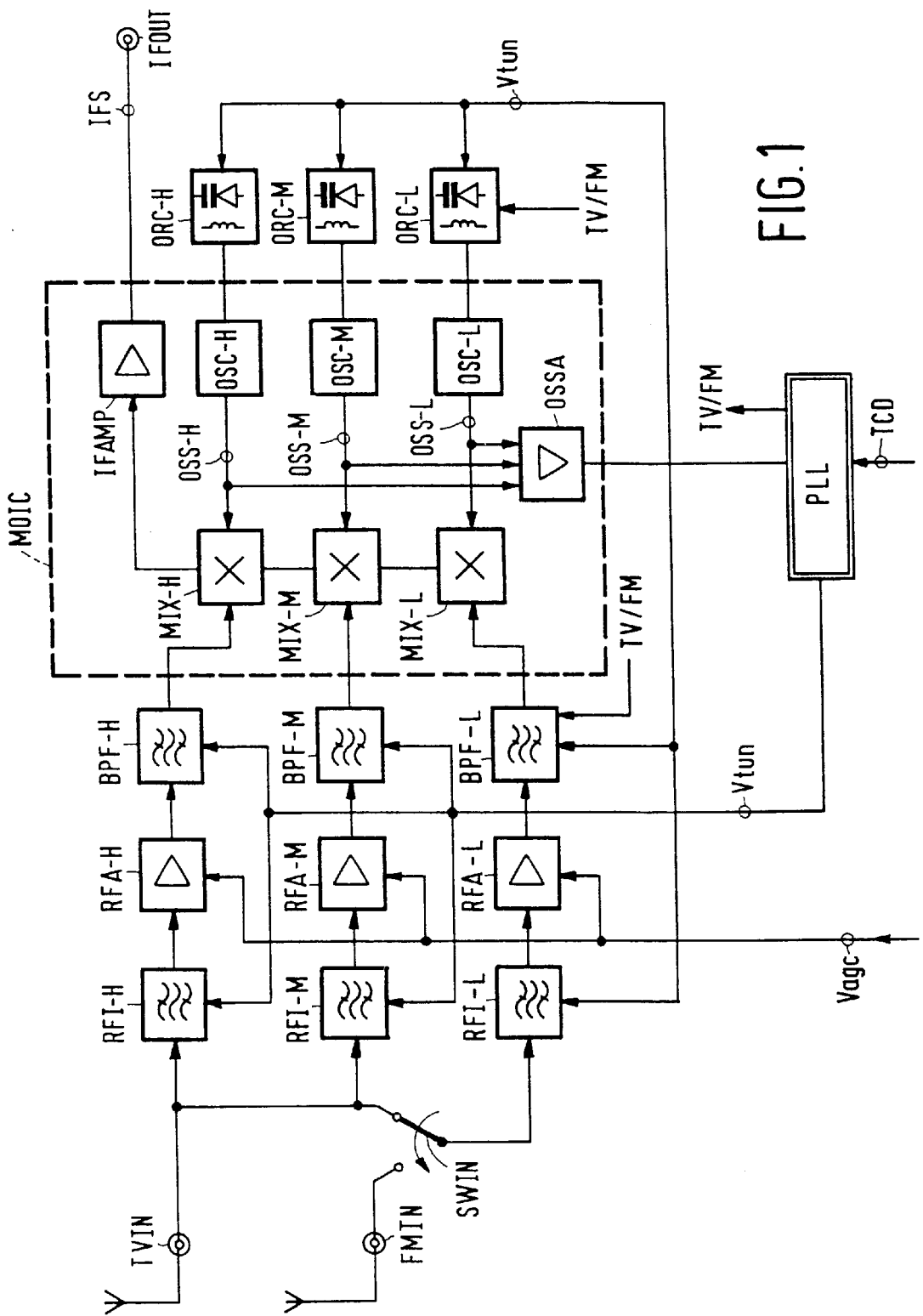
FIG. 1 shows an example of a tuner in accordance with the invention, in the form of a block diagram.

Referring to the FIG. 1 tuner, TV and FM-radio signals may be applied at inputs TVIN and FMIN, respectively. The FIG. 1 tuner receives tuning control data TCD relating to a desired reception signal, for example the frequency and the type of signal: TV or FM. In response to the desired reception signal, the FIG. 1 tuner provides an intermediate frequency signal IFS at an output IFOUT.

The FIG. 1 tuner can operate in two modes: a TV-mode, if the desired reception signal is a TV signal, or an FM-mode, if the desired reception signal is an FM-radio signal. In the TV-mode, the intermediate frequency signal IFS is at an intermediate frequency of 38.9 MHz, hereinafter abbreviated to TV-IF. In the FM-mode, the intermediate frequency signal IFS is at an intermediate frequency of 10.7 MHz, hereinafter abbreviated to FM-IF.

The FIG. 1 tuner is based on a so-called three-band concept. This means that the FIG. 1 tuner comprises three separate branches for processing the TV signals in three respective frequency bands: high-band, medium-band and low-band. Each branch comprises the following parts: an input filter RFI-H/-M/-L, an input amplifier RFA-H/-M/-L, a band-pass filter BPF-H/-M/-L, a mixer MIX-H/-M/-L, an oscillator circuit OSC-H/-M/-L and an oscillator resonant circuit ORC-H/-M/-L. The suffixes -H, -M and -L used in the reference signs for these parts indicate whether a relevant part belongs to the high-, medium- or low-band branch. The FIG. 1 tuner may be implemented by using a mixer-oscillator integrated circuit MOIC, for example, of the type TDA 5736 manufactured by Philips Semiconductors, which comprises the parts present within the dotted rectangle designated MOIC in FIG. 1.

In the FIG. 1 tuner, FM-radio signals are processed in the low-band branch. A switch SWIN couples the low-band branch either to the input TVIN or to the input FMIN. In the first case, TV signals are supplied to the low-band branch, in the other case, FM-radio signals are supplied to the low-band branch. The position of the switch SWIN may depend on the mode, TV or FM, in which the FIG. 1 tuner operates. However, in some applications, it may be preferable to control the switch SWIN independently of the mode. For example, FM-radio signals may be present both at the input TVIN and at the input FMIN. In that case, it may be advantageous to select the position of the switch SWIN, in the FM-mode, for best FM-radio reception. A kind of antenna diversity is provided. One antenna may be a wire antenna coupled to the input FMIN, for example, the other antenna may be a VHF/TV antenna, for example, via which FM-radio signals can also be received.

In each branch, the input filter RFI-H/-M/-L attenuates signals which are relatively distant in frequency from the desired reception signal so as, to prevent overload of the input amplifier RFA-H/-M/-L. The amplifier RFA-H/-M/-L is controlled by a gain control voltage Vagc. The band-pass filter BPF-H/-M/-L provides a further attenuation of undesired signals. The mixer MIX-H/-M/-L effects a frequency shift of the desired reception signal by multiplying the desired reception signal with an oscillator signal OSS-H/-M/-L. The oscillator signal OSS-H/-M/-L is generated by the oscillator circuit OSC-H/-M/-L and the oscillator resonant circuit ORC-H/-M/-L, which determines the frequency of the oscillator signal OSS-H/-M/-L. The mixer provides the intermediate frequency signal IFS, via an intermediate frequency amplifier IFAMP.

In each branch, a phase-locked loop circuit PLL controls the oscillator signal OSS-H/-M/-L of the relevant branch. The phase-locked loop circuit PLL derives, in a conventional manner, a tuning voltage Vtun from the tuner control data TCD and the oscillator signal OSS-H/-M/-L received via an oscillator signal amplifier OSSA. The tuning voltage Vtun is applied to the oscillator resonant circuit ORC-H/-M/-L. In the TV-mode, the oscillator signal OSS-L in the low band-branch is set to a frequency which is the sum of the desired reception signal and the TV-IF (38.9 MHz). In the FM-mode, the oscillator signal OSS-L is set to a frequency which is the sum of the desired reception signal and the FM-IF (10.7 MHz).

In each branch, the tuning voltage Vtun is also used to vary the respective passbands of the input filter RFI-H/-M/-L and the band-pass filter. Preferably, the passbands should encompass the desired reception signal. If not, the desired reception signal is distorted and undesired signals may not be sufficiently attenuated. In the TV-mode, the passbands should encompass the difference of the oscillator signal frequency and the TV-IF. In the FM-mode, the passbands should be cenetred at the difference of the oscillator signal frequency and the FM-IF. The position of the passbands with respect to the frequency of the oscillation signal, while tuning through the reception bands, is hereinafter referred to as tracking.

The phase-locked loop circuit PLL also provides a mode-switch signal TV/FM. In the low-band branch, the mode-switch signal TV/FM is used to switch the oscillator resonant circuit ORC-L. The oscillator signal OSS-L is switched to a higher frequency in the TV-mode than in the FM-mode, for a given value of the tuning voltage Vtun. Respective passbands of the input filter RFI-L and the band-pass filter BPF-L remain substantially constant for a given value of the tuning voltage Vtun. Thus, the frequency offset between the input filter RFI-L and the band-pass filter BPF-L, on the one hand, and the oscillator signal OSS-L, on the other hand, is switched. The frequency offset is preferably switched to the TV-IF in the TV-mode, and to the FM-IF in the FM-mode.

In addition, the mode control signal TV/FM preferably switches the pass-bandwidth of the band-pass filter BPF-L in the low-band branch. In the TV-mode, the band-pass filter BPF-L has a preferably relatively wide passband, for example, 10 MHz, whereas in the FM-mode, the passband is preferably relatively narrow, for example, 1 MHz.

Figure 2:
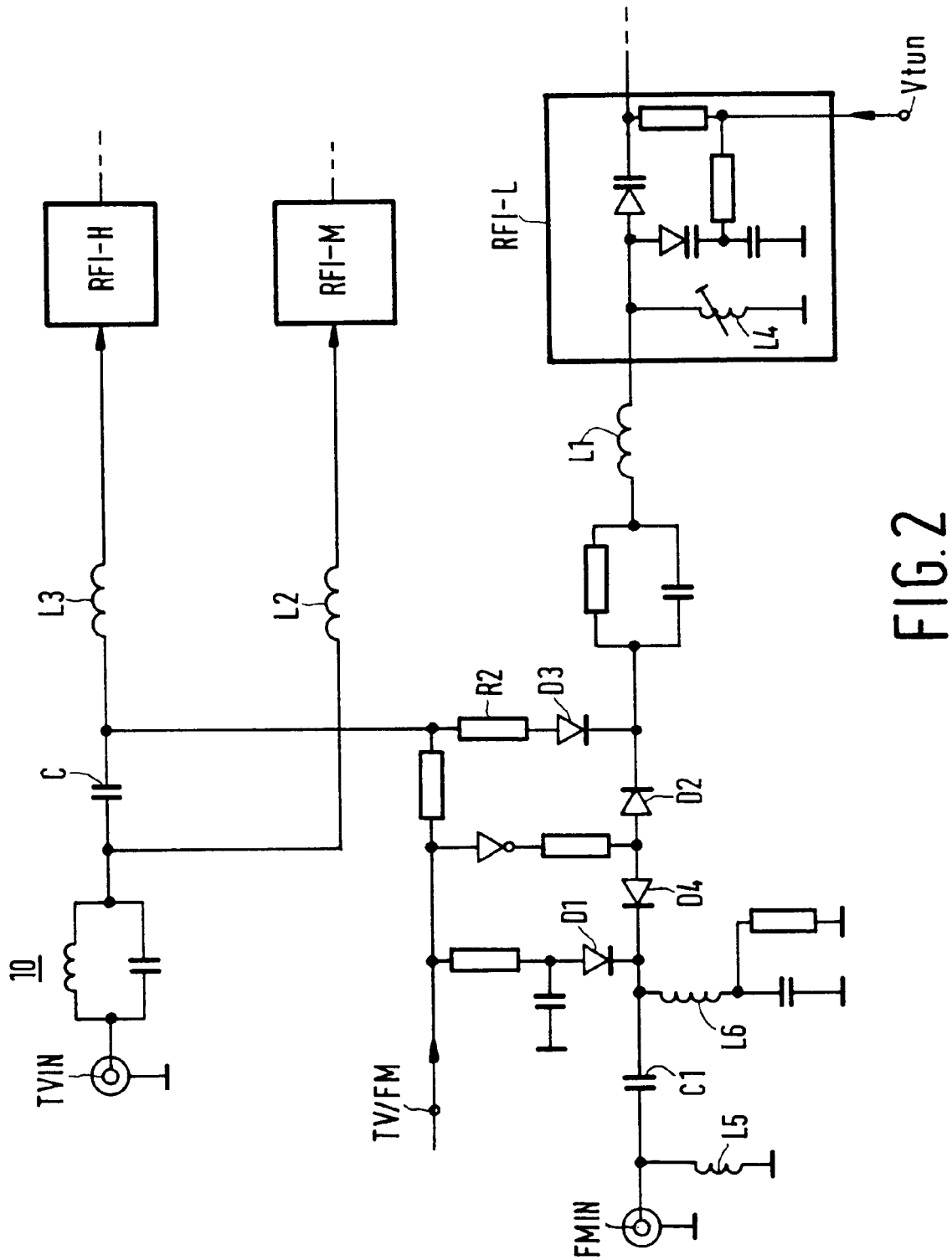
FIG. 2 shows, in a circuit diagram form, an example of a switchable input section for conveying signals to various branches in the FIG. 1 tuner.

FIG. 2 shows, in a circuit diagram form, an example of a switchable input section for conveying signals at the inputs TVIN and FMIN to the low-band, medium-band and high-band branches in the FIG. 1 tuner. It should be noted that the switch SWIN shown in FIG. 1 is a functional representation of the FIG. 2 input section, rather than an electrical equivalent. The FIG. 2 input section not only provides switching, but also includes circuitry for suitably routing high-band, mid-band and low-band TV signals from the input TVIN to the relevant branches.

The FIG. 2 input section is based on a prior-art TV-RF input circuit which is described in U.S. Pat. No. 4,851,796, herein incorporated by reference herein. Elements in FIG. 2, which correspond to the prior-art TV-RF input circuit, are the following: an image trap 10, inductances L1, L2 and L3, and a capacitor C. In FIG. 2, the reference signs of the aforemetioned elements are identical to reference signs of corresponding elements in the Figure of U.S. Pat. No. 4,851,796 which shows the prior-art TV-RF input circuit.

In accordance with the present example of the invention, the FIG. 2 input section comprises four switching diodes D1, D2, D3 and D4, respectively. In the FM-mode, switching diodes D2 and D4 are conducting, while switching diodes D1 and D3 are both non-conducting. In the TV-mode, the switching diodes D1 and D3 are conducting, while the switching diodes D2 and D4 are non-conducting. The four switching diodes D1, D2, D3 and D4 may be controlled by the mode control signal TV/FM, present in the FIG. 1 tuner, in a common manner. However, in some applications, it may be preferable to control the switch SWIN independently of the mode, TV or FM, in which the tuner operates. Accordingly, in these applications a separate control signal will be used for controlling the switch SWIN.

In the FIG. 2 input section, in the TV-mode, the switching diode D1 effectively short-circuits the input FMIN to which FM-radio signals are applied. This promotes the reception quality of high-band TV signals in particular, which can be explained as follows.

The source connected to the input FMIN may not have a well-defined impedance. For example, it is very well possible that a user just connects a piece of wire, as this will often be sufficient to receive local FM-radio stations with sufficient quality. The impedance of such a wire-antenna is quite undefined and, moreover, the impedance may vary considerably over the TV frequency range from, say, 48 to 855 MHz. If the input FMIN is not sufficiently isolated from the TV-RF input circuit, this may affect the power matching between the source connected to the input TVIN and the relevant input filter RFI-H/-M/-L.

In the TV-mode, the switching diodes D2 and D4 provide isolation. However, in the TV-mode, the switching diodes D2 and D4 are reverse biased and have parasitic capacitances. As a result, the isolation becomes weaker and weaker with increasing frequency. Depending on, for example, the wire-antenna connected to the input FMIN, it may happen that an insufficient amount of TV signal power is transferred to the relevant input filter. Especially the high-band TV signals may be affected in that sense. The above described problem is solved by effectively short-circuiting the input FMIN in the TV-mode.

In the FIG. 2 input section, the isolation is provided, as already mentioned, by the switching diodes D2 and D4, which are arranged in a back-to-back configuration. This additional feature also promotes the reception quality of high-band signals, which can be explained as follows. In practice, the parasitic capacitance of the isolation of the input FMIN may form, in combination with a parasitic inductance of a connection, for example, a parasitic resonant circuit which causes poor matching. By halving the parasitic capacitance, for example, the parasitic resonant circuit may be de-tuned sufficiently to obtain satisfactory power matching.

The FIG. 2 input section comprises a resistance R2 in series with the switching diode D3. Depending on the state of the switching diode D3, the resistance R2 affects or does not affect the characteristics of the input filter RFI-L, which is shown in detail. The input filter RFI-L is basically a parallel resonant circuit, which includes an inductance L4. In the FM-mode, the switching diode D3 is non-conducting, so that the resistance R2 is effectively isolated from the parallel resonant circuit, which has a relatively high quality factor. In the TV-mode, however, the switching diode D3 conducts and the resistance R2 effectively reduces the quality factor of the parallel resonant circuit in the input filter RFI-L. This produces the advantageous effect that, in the FM-mode, the input filter RFI-L has a narrower bandwidth than in the TV-mode.

In the FIG. 2 input section, the input FMIN is coupled to switching diodes D1 and D4 via an FM input filter. The FM input filter is formed by two inductances L5 and L6 and a capacitance C1. Elements in FIG. 2 which have no reference signs, are used for suitably coupling AC and/or DC signals, as those skilled in the art will immediately recognize. Consequently, these elements do not need to be further discussed in this specification.

Figure 3:
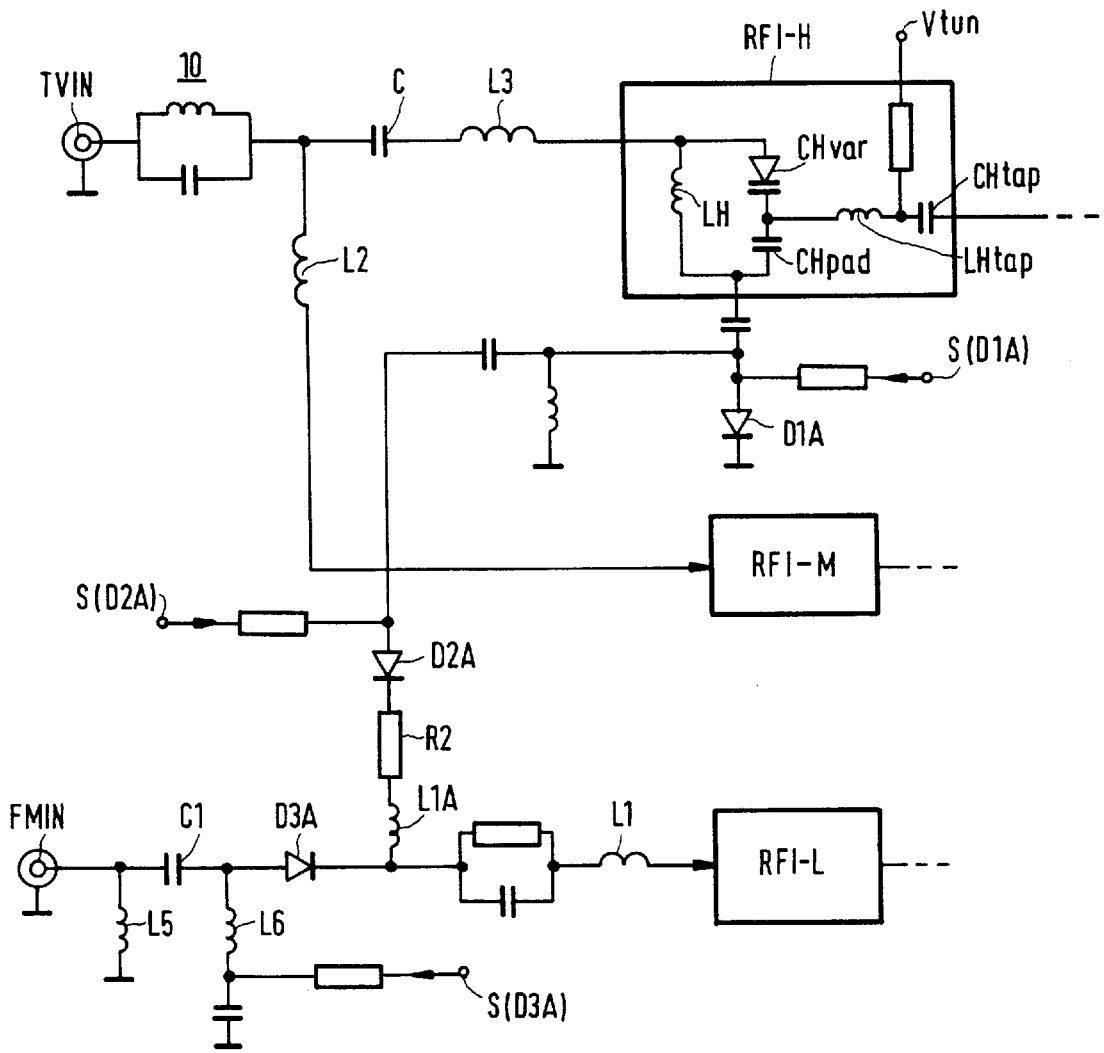
FIG. 3 shows, in a circuit diagram form, an example of a preferred switchable input section for conveying signals to various branches in the FIG. 1 tuner.
Figure 4:
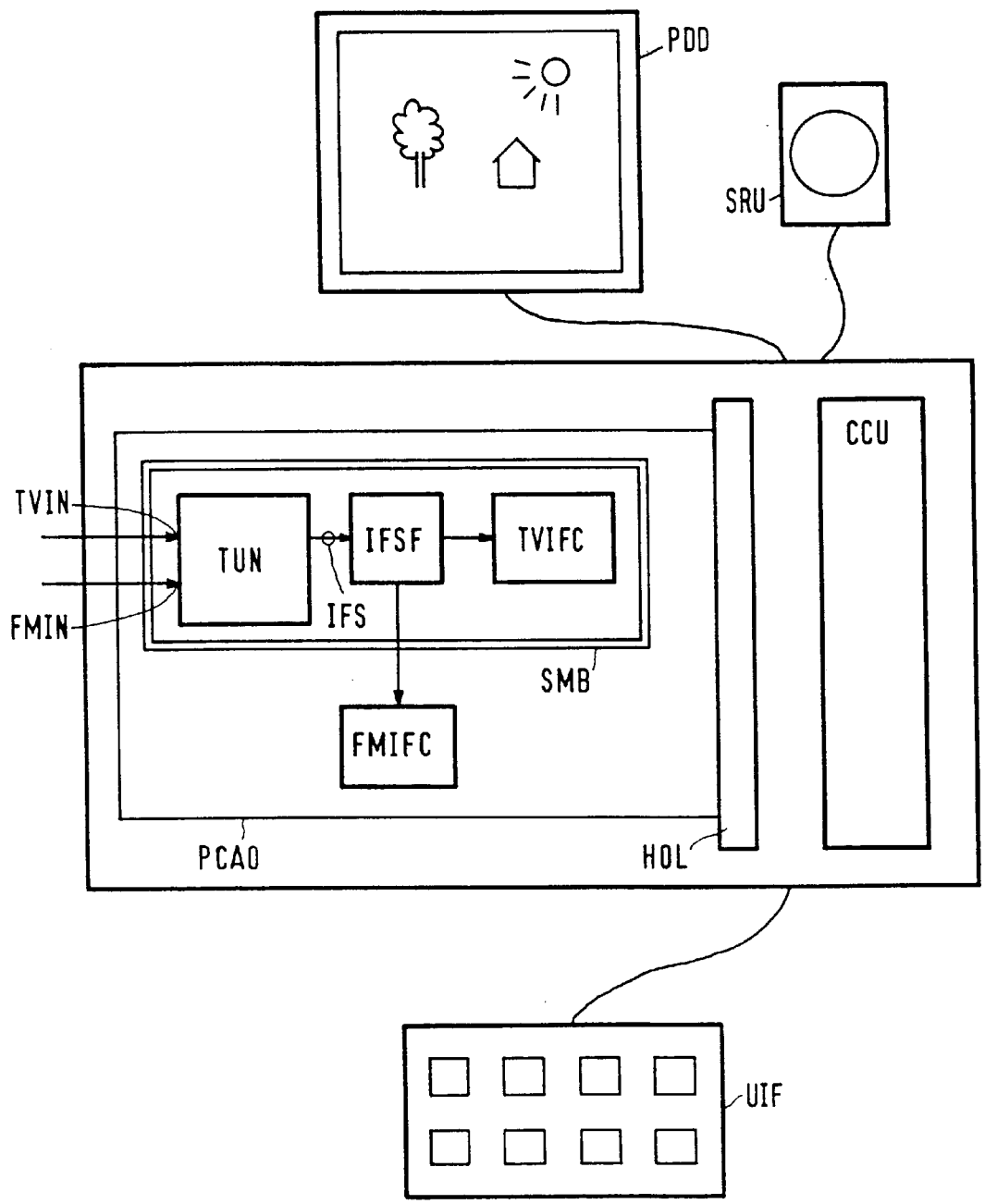
FIG. 4 shows, in an abstract diagram form, an example of a multimedia apparatus comprising the FIG. 1 tuner.

FIG. 3 shows, in a circuit diagram form, a preferred input section for conveying signals at the inputs TVIN and FMIN to the low-band, medium-band and high-band branches in the FIG. 1 tuner. Like the FIG. 2 input section, the FIG. 3 input section is based on the prior-art TV-RF input circuit described in U.S. Pat. No. 4,851,796. However, in accordance with the present example of the invention, in the FIG. 3 input section, low-band TV signals at the input TVIN are routed to the low-band branch in a different manner than in the FIG. 2 input section. In the FIG. 3 input section, low-band TV signals are applied to the input filter RFI-L via the input filter RFI-H in the high-band branch.

In FIG. 3, the input filter RFI-H in the high-band branch, through which low-band TV signals are routed, is shown in detail. The input filter RFI-L comprises an inductance LH, a varicap diode CHvar and a capacitance CHpad, which constitute a parallel resonant circuit. A signal in the parallel resonant circuit is tapped off via a series arrangement of an inductance LHtap and a capacitance CHtap. The inductance LH in the input filter RFI-H should have a value which is suitable for tuning the parallel resonant circuit in the high-band. Consequently, the LH in the low-band may have a relatively small impedenace and, by way of approximation, may be seen as a short-circuit in the low-band.

The FIG. 3 input section comprises three switching diodes D1A, D2A and D3A, instead of four as in the FIG. 2 input section. When switching diode D1A is conducting, one end of the parallel resonant circuit in the input filter RFI-H is effectively coupled to ground. However, when the switching diode D1A is non-conducting, a low-band TV signal may be transferred via the input filter RFI-H to the input filter RFI-L. For such a transfer, switching diode D2A should be in a conductive state. When switched to a non-conductive state, Switching diode D3A provides a satisfactory isolation of the input FMIN from the TV-RF circuit. A switching diode for effectively short-circuiting the input FMIN, like the switching diode D1 in FIG. 2, is not present in the FIG. 3 input section.

The FIG. 3 input section can be divided into four switching states: TV-low, TV-mid, TV-high and FM. Table 1 below lists the relation between the switching state and the state of each of the three switching diodes individually. In Table 1, a 0 indicates that the relevant switching diode is in a non-conductive state, and a 1 indicates that it is in a conductive state.

TABLE 1

|  | D1A | D2A | D3A |
| --- | --- | --- | --- |
| TV-low | 0 | 1 | 0 |
| TV-mid | 0 | 0 | 0 |
| TV-high | 1 | 0 | 0 |
| FM | 1 | 0 | 1 |

In FIG. 3, each of the three switching diodes D1A, D2A and D3A receives an individual control signal S(D1A), S(D2A) and S(D3A), respectively. The control signals may be obtained, for example, from the phase-locked loop circuit PLL via a band-switching logic circuit (not shown).

In the TV high-band switching state, any undefined impedance at the input FMIN is very well insulated from the high-band branch, because all three switching diodes D1A, D2A and D3A effectively contribute to that insulation. In the TV high-band switching state, switching diodes D2A and D3A are non-conducting and the switching diode D1A is conducting. In the FM switching state, the switching diode D3A is conducting for conveying an FM-radio signal at the input FMIN to the low-band branch. The switching diode D1A and the switching diode D2A are non-conducting to insulate the input TVIN from the low-band branch.

In the FIG. 3 input section, an inductance L1A is coupled in series with the resistor R2, whose function was already explained with reference to FIG. 2. The inductance L1A tunes the input filter RFI-L differently in the TV-mode and in the FM-mode. Referring to the FIG. 1 tuner, the difference in tuning may advantageously be used to compensate for any de-tuning of the band-pass filter BPF-L, as a result of passband switching of this filter. With an appropriate value of the inductance L1A, the passbands of the input filter RFI-L and the band-pass filter BPF-L are substantially matched.

Elements in FIG. 3 which have no reference signs, are used for suitably coupling AC and/or DC signals, as those skilled in the art will immediately recognize. Consequently, these elements do not need to be further discussed in this specification.

FIG. 5 shows an example of a multimedia apparatus comprising the FIG. 1 tuner TUN. The FIG. 1 tuner TUN is implemented on an add-on card PCAO, which add-on cart PCAO is plugged into an add-on card holder HOL of the multi-media apparatus. Apart from the FIG. 1 tuner TUN, the add-on card includes TV IF signal processing circuitry TVIFC and FM IF signal processing circuitry FMIFC. The latter circuitries receive the intermediate frequency signal IFS provided by the FIG. 1 tuner TUN via an IF splitting filter IFSF. The FIG. 1 tuner TUN, the IF splitting filter IFSF and the TV IF signal processing circuitry TVIFC are housed in a shielded metal box SMB. The shielded metal box SMB with the aforementioned parts may, as such, be manufactured as such and sold to add-on card manufacturers.

The FIG. 5 multimedia apparatus includes a user-interface UIF, a control unit CCU, a picture display device PDD, a sound reproduction unit SRU. A user selects the desired reception signal via the user-interface UIF. For example, he may enter a program number on a keyboard which is part of the user-interface UIF. The control unit CCU effectively controls the add-on card PCAO in such a way that the FIG. 1 tuner TUN selects the desired reception signal. For example, the control unit CCU provides instructions which are stored in a memory (not shown) relating to the frequency of the desired reception signal and the type of signal: FM or TV. These instructions are supplied to the FIG. 1 tuner TUN in the form of the tuner control data TCD. The add-on card PCAO provides sound and/or video information, for example, obtained from the desired reception signal, which information may be further processed in the control unit CCU. The sound and/or video information is provided to the user via the sound reproduction unit SRU and the picture display device PDD, respectively.

Evidently, the invention may be implemented differently from the examples described above. To indicate that the scope of the invention claimed is well beyond the examples described above, some final remarks are made.

It should be noted that the invention is not limited to combined TV and FM-radio reception, two different types of reception signals, or two inputs, such as the inputs TVIN and FMIN. If so desired, more inputs can be used.

Moreover, the invention is not limited to multimedia applications. The invention may be used in any apparatus comprising a receiver, such as TV receivers and video-tape recorders.

It should also be noted that the invention is not limited to a 3-band tuner concept, as shown in FIG. 1. In principle, the invention may be applied in any tuner concept, for example in a 2-band tuner concept.

It should further be noted that the invention is not limited to the use of an RF-TV input circuit as described in U.S. Pat. No. 4,851,796.

Finally, should be noted that a larger or smaller number of switching diodes can be used. For example, in the FIG. 2 input section, any one of the switching diodes D2 and D4 may be dispensed with. The switching diode D4 may be replaced by for example, a capacitor.

I claim:

1. A receiver for receiving reception signals of a first type and a second type, the receiver comprising:
   an input section for receiving a reception signal;
   a tuner for providing, in response to the reception signal, an intermediate frequency signal;
   a first intermediate frequency signal processing arrangement coupled to said tuner for processing said intermediate frequency signal when said reception signal is of the first type; and
   a second intermediate frequency signal processing arrangement coupled to said tuner for processing said intermediate frequency signal when said reception signal is of the second type,
   characterized in that said input section comprises a plurality of inputs to which the reception signal may be applied, and a switch for effectively decoupling at least one of said plurality of inputs from the tuner.

2. A receiver as claimed in claim 1, characterized in that said tuner is a multi-band type for processing the reception signal in one of a plurality of branches depending on a frequency of the reception signal, said switch being coupled to an input of one of said plurality of branches.

3. A tuner for receiving reception signals of a first type and a second type, the tuner comprising:
   an input section for receiving a reception signal; and
   a mixer-oscillator arrangement for providing, in response to the reception signal, an intermediate frequency signal, characterized in that said input section comprises a plurality of inputs to which the reception signal may be applied, and a switch for effectively decoupling at least one of said plurality of inputs from the tuner.

4. A multimedia apparatus comprising:
   a receiver for receiving reception signals of a first type and a second type; and
   a control unit for controlling said receiver and for processing data signals, the receiver comprising:
   an input section for receiving a reception signal;
   a tuner for providing, in response to the reception signal, an intermediate frequency signal;
   a first intermediate frequency signal processing arrangement coupled to said tuner for processing said intermediate frequency signal when said reception signal is of the first type; and
   a second intermediate frequency signal processing arrangement coupled to said tuner for processing said intermediate frequency signal when said reception signal is of the second type,
   characterized in that said input section comprises a plurality of inputs to which the reception signal may be applied, and a switch for effectively decoupling at least one of said plurality of inputs from the tuner.

* * * * *